US009236443B2

(12) United States Patent
Ren et al.

(10) Patent No.: US 9,236,443 B2
(45) Date of Patent: Jan. 12, 2016

(54) HIGH ELECTRON MOBILITY TRANSISTORS HAVING IMPROVED RELIABILITY

(71) Applicant: University of Florida Research Foundation, Incorporated, Gainesville, FL (US)

(72) Inventors: Fan Ren, Gainesville, FL (US); Stephen John Pearton, Gainesville, FL (US); Jihyun Kim, Seoul (KR)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 14/420,496

(22) PCT Filed: Sep. 11, 2013

(86) PCT No.: PCT/US2013/059190
§ 371 (c)(1),
(2) Date: Feb. 9, 2015

(87) PCT Pub. No.: WO2014/043187
PCT Pub. Date: Mar. 20, 2014

(65) Prior Publication Data
US 2015/0236122 A1    Aug. 20, 2015

Related U.S. Application Data

(60) Provisional application No. 61/699,341, filed on Sep. 11, 2012.

(51) Int. Cl.
*H01L 29/66* (2006.01)
*H01L 29/778* (2006.01)
(Continued)

(52) U.S. Cl.
CPC ........ *H01L 29/66462* (2013.01); *H01L 21/266* (2013.01); *H01L 21/2654* (2013.01); *H01L 29/2003* (2013.01); *H01L 29/205* (2013.01); *H01L 29/778* (2013.01)

(58) Field of Classification Search
CPC . H01L 29/205; H01L 29/2003; H01L 29/778; H01L 21/266; H01L 21/2654
USPC .......................................................... 257/76
See application file for complete search history.

(56) References Cited

U.S. PATENT DOCUMENTS 3,515,956 A    6/1970    Martin et al.
7,122,448 B2   10/2006   Ito et al.
(Continued)

FOREIGN PATENT DOCUMENTS

KR    10-20110105032    1/2012

OTHER PUBLICATIONS

Cho, Kyu-Heon et al., "High Breakdown Voltage AlGaN/GaN HEMTs by Employing Proton Implantation," Proceedings of the 20th International Symposium on Power Semiconductor Devices & IC's, 2008.*

(Continued)

*Primary Examiner* — Tuan Nguyen
(74) *Attorney, Agent, or Firm* — Saliwanchik, Lloyd & Eisenschenk

(57) ABSTRACT

High electron mobility transistors (HEMTs) having improved I-V characteristics and reliability are provided. According to one embodiment, a selective implantation is performed to form a damage region in a gate-to-drain region of, for example, an InAlN/GaN HEMT. The selective implantation can be performed by irradiating some or all of a gate-to-drain region of an InAlN/GaN HEMT on a substrate with protons or other ions such as Ge ions, He ions, N ions, or O ions. The damage region can extend in a region below a 2DEG interface of the HEMT.

8 Claims, 7 Drawing Sheets

(51) Int. Cl.
  *H01L 29/20* (2006.01)
  *H01L 29/205* (2006.01)
  *H01L 21/265* (2006.01)
  *H01L 21/266* (2006.01)

(56) References Cited

U.S. PATENT DOCUMENTS

| | | | |
|---|---|---|---|
| 7,476,629 | B2 | 1/2009 | Tanaka |
| 2006/0124934 | A1 | 6/2006 | Fukumiya et al. |
| 2006/0163594 | A1 | 7/2006 | Kuzmik |
| 2009/0090984 | A1 | 4/2009 | Khan et al. |
| 2011/0076790 | A1 | 3/2011 | Ofuji et al. |
| 2011/0212582 | A1* | 9/2011 | Hong ............... H01L 29/0891 438/172 |
| 2011/0220966 | A1 | 9/2011 | Wu et al. |
| 2012/0211800 | A1 | 8/2012 | Boutros |

OTHER PUBLICATIONS

Antoszewski, J et al., "Scattering mechanisms limiting two-dimensional electron gas mobility in $Al_{0.25}Ga_{0.75}N/GaN$ modulation-doped field-effect transistors," *Journal of Applied Physics*, 2000, 87.
Kim, Hong-Yeol et al., "AlGaN/GaN High Electron Mobility Transistors Irradiated with 17 MeV Protons," *Journal of the Electrochemical Society*, 2008, 155(7).
Antoszewski, J et al., "Scattering mechanisms limiting two-dimensional electron gas mobility in $Al_{0.25}Ga_{0.75}N/GaN$ modulation-doped field-effect transistors," *Journal of Applied Physics*, 2000, 87, Abstract only.
Chabak, Kelson D. et al., "Strained AlInN/GaN HEMTs on SiC With 2.1-A/mm Output Current and 104-GHz Cutoff Frequency," *IEEE Electron Device Lettesr*, 2010, 31(6):561-563.
Chang, Chih-Yang et al., "Reverse gate bias-induced degradation of AlGaN/GaN high electron mobility transistors," *Journal of Vacuum Science & Technology B*, 2010, 28(5):1044-1047.
Cho, Kyu-Heon et al., "High Breakdown Voltage AlGaN/GaN HEMTs by Employing Proton Implantation," *Proceedings of the 20th International Symposium on Power Semiconductor Devices & IC's*, 2008, Abstract only.
Del Alamo, J.A et al., "GaN HEMT reliability," *Microelectronics Reliability*, 2009, 49:1200-1206.
Dhaka, V.D.S et al., "Room-temperature self-annealing of heavy-ion-irradiated InGaAs/GaAs quantum wells," *Electronic Letters*, 2005, 41(23):1-3.
Gaquiere, C et al., "AlInN/GaN a suitable HEMT device for extremely high power high frequency applications," *IEEE Electron Device Letters*, 2007, 2145-2148.
Hu, Xinwen, et al., "Proton-Irradiation Effects on AlGaN/AlN/GaN High Electron Mobility Transistors," *IEEE Transactions on Nuclear Science*, 2003, 50(6):1791-1796.
Jessen, G.H et al., "RF Power Measurements of InAlN/GaN Unstrained HEMTs on SiC Substrates at 10 GHz," *IEEE Electron Device Letters*, 2007, 28(5):354-356.
Jessen, Gregg H. et al., "Short-Channel Effect Limitations on High-Frequency Operation of AlGaN/GaN HEMTs for T-Gate Devices," *IEEE Electron Device Letters*, 2007, 2589-2597.
Karmarkar, Aditya P. et al., "Proton Irradiation Effects on GaN-Based High Electron-Mobility Transistors With Si-Doped $Al_xGa_{1-x}N$ and Thick GaN Cap Layers," *IEEE Transactions on Nuclear Science*, 2004, 51(6):3801-3806.
Kim, H.Y. et al., "Proton-irradiated InAlN/GaN high electron mobility transistors at 5, 10, and 15 MeV energies," *Applied Physics Letters*, 2012, 100:1-3.

Kim, Hong-Yeol et al., "AlGaN/GaN High Electron Mobility Transistors Irradiated with 17 MeV Protons," *Journal of the Electrochemical Society*, 2008, 155(7): Abstract only.
Kordoš, Peter et al., "RF Performance of InAlN/GaN HFETs and MOSHFETs With $f_T \times L_G$ up to 21 GHz • µm," *IEEE Electron Device Letters*, 2010, 31(3):180-182.
Kuzmik, J. et al., "Analysis of degradation mechanisms in lattice-matched InAlN/GaN high-electron-mobility transistors," *Journal of Applied Physics*, 2009, 106:1-7.
Kuzmík, Ján. "Power Electronics on InAlN/(In)GaN: Prospect for a Record Performance," *IEEE Electron Device Letters*, 2001, 22(11):510-512.
Leach, J.H. et al., "Degradation in InAlN/GaN-based heterostructure field effect transistors: Role of hot phonons," *Applied Physics Letters*, 2009, 95:1-3.
Liu, Lu et al., "Effect of source field plate on the characteristics of off-state, step-stressed AlGaN/GaN high electron mobility transistors," *Journal of Vacuum Science &Technology B*, 2011, 29(3):1-6.
Lo, C.F. et al., "Effects of proton irradiation on dc characteristics of InAlN/GaN high electron mobility transistors," *Journal of Vacuum Science & Technology B*, 2011, 29(6):1-6.
Luo, B. et al., "Dc and rf performance of proton-irradiated AlGaN/GaN high electron mobility transistors," *Applied Physics Letters*, 2001, 79(14):2196-2199.
Medjdoub, F. et al., "Barrier-Layer Scaling of InAlN/GaN HEMTs," *IEEE Electron Device Letters*, 2008, 29(5):422-425.
Medjdoub, F. et al., "Small-signal characteristics of AlInN/GaN HEMTs," *Electronics Letters*, 2006, 42(13):1-3.
Medjdoub, F. et al., "Status of the Emerging InAlN/GaN Power HEMT Technology," *The Open Electrical and Electronic Engineering Journal*, 2008, 2:1-7.
Oberhuber, R. et al., "Mobility of two-dimensional electrons in AlGaN/GaN modulation-doped field effect transistors," *Applied Physics Letters*, 1998, 73(6):818-820.
Sonia, G. et al., "Proton and Heavy Ion Irradiation Effects on AlGaN/GaN HFET Devices," *IEEE Transactions on Nuclear Science*, 2006, 53(6):3661-3666.
Sun, Haifeng et al., "100-nm-Gate (Al,In) N/GaN HEMTs Grown on SiC With $F_T = 144$ GHz," *IEEE Electron Device Letters*, 2010, 31(4):293-295.
Sun, Haifeng et al., "102-GHz AlInN/GaN HEMTs on Silicon With 2.5-W/mm Output Power at 10 GHz," *IEEE Electron Device Letters*, 2009, 30(8):796-798.
Tirelli, Stefano et al., "107-GHz (Al,Ga)N/GaN HEMTs on Silicon With Improved Maximum Oscillation Frequencies," *IEEE Electron Device Letters*, 2010, 31(4):296-298.
Usenko, Alexander. "Irradiation-Then-Anneal Processing to Improve BSIT Performance," *IEEE Transactions on Electron Devices*, 1994, 41(6):1055-1061.
Vitusevich, S.A. et al., "Effects of γ-irradiation on AlGaN/GaN-based HEMTs," *Phys. Stat. Sol. (a)*, 2003, 195(1):101-105.
Wang, Han et al. "$Al_2O_3$ passivated InAlN/GaN HEMTs on SiC substrate with record current density and transconductance," *Physica Status Solidi (c)*, 2010, 7(10): 2440-2444.
White, B.D. et al., "Electrical, Spectral, and Chemical Properties of 1.8 MeV Proton Irradiated AlGaN/GaN HEMT Structures as a Function of Proton Fluence," *IEEE Transactions on Nuclear Science*, 2003, 50(6):1934-1941.
Xue, JunShuai et al., "Nearly lattice-matched InAlN/GaN high electron mobility transistors grown on SiC substrate by pulsed metal organic chemical vapor deposition," *Applied Physics Letters*, 2011, 98:1-4.

* cited by examiner

HIGH ELECTRON MOBILITY TRANSISTORS HAVING IMPROVED RELIABILITY

CROSS REFERENCE TO A RELATED APPLICATION

This application is a National Stage Application of International Application Number PCT/US2013/059190, filed Sep. 11, 2013; which claims the benefit of U.S. Provisional Application Ser. No. 61/699,341, filed Sep. 11, 2012; both of which are incorporated herein by reference in their entirety.

This invention was made with government support under Grant No. 1-11-1-0020 awarded by U.S. Department of Defense (DoD) Defense Threat Reduction Agency (DTRA). The government has certain rights in the invention.

BACKGROUND

Preliminary research on InAlN/GaN high electron mobility transistors (HEMTs) has indicated that InAlN/GaN HEMTs could be an excellent candidate to replace conventional AlGaN/GaN heterostructures in certain electronics applications. InAlN/GaN HEMTs exhibit higher current densities and higher powers compared to typical AlGaN-based HEMTs because of the large spontaneous polarization between InAlN and GaN that enables a high density two dimensional electron gas (2-DEG) above $2.5 \times 10^{13}$ cm$^{-2}$ to be achieved.

Promising DC, RF and output power performances of InAlN/GaN HEMTs on Si, sapphire and SiC substrates have been reported, indicating the suitability of InAlN/GaN HEMTs for high power and high frequency applications such as broadband communication and power flow control. As one characteristic that benefits device reliability, InAlN with an In mole fraction of 0.17 can be grown lattice-matched to GaN, which eliminates the strain present in the AlGaN/GaN heterostructure system. However, there continues to be a need for improved reliability in InAlN/GaN HEMTs.

BRIEF SUMMARY

Techniques for improved reliability of the HEMTs and the resultant HEMT structures are provided herein. In accordance with various embodiments of the invention, selective area implantation is performed to introduce "damage" to the gate to drain region of HEMT structures including, but not limited to, AlGaN/GaN, AlN/GaN, InAlN/GaN, and HEMTs with an InGaN channel.

In one embodiment, selective area proton irradiation/ion implantation is performed to improve the reliability of InAlN/GaN HEMTs.

In certain embodiments, proton irradiation is performed at energies of 5 MeV-15 MeV. Various embodiments of the invention perform proton irradiation at energies in the hundreds of keV, for example at 300 keV-400 keV. In one embodiment, Ge ions are used. In another embodiment, smaller ions are used.

According to certain aspects of the invention, the critical voltage and the breakdown voltage can be increased, and the reliability of the transistors can be improved.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

Techniques are disclosed for improved reliability of HEMTs. In accordance with various embodiments of the invention, selective area implantation is performed to introduce "damage" to the gate to drain region of the HEMT. The damage being introduced is the creating of point defects, such as vacancies, in the underlying material being implanted in a manner that generates a virtual gate on the drain side of the gate edge to change the gate electrode filed distribution.

In one embodiment, selective area proton irradiation/ion implantation is performed to improve the reliability of InAlN/GaN HEMTs. In certain embodiments, proton irradiation is performed at energies of 5 MeV-15 MeV. Since MeV energies requires special tools not generally used in conventional semiconductor device fabrication, various embodiments of the invention perform proton irradiation at energies in the hundreds of keV, for example at 400 keV. In one embodiment, Ge ions are used. In another embodiment, smaller ions are used.

Although proton irradiation improves HEMT drain breakdown voltage and reliability, ion bombardment damage to a source region increases the source resistance, degrading the transfer characteristics and decreasing the extrinsic peak transconductance. Accordingly, embodiments of the invention minimize damage to a source region by protecting the source region during irradiation.

In accordance with various embodiments of the invention, a selective area implantation technique is performed to implant a part of or an entirety of the gate to drain region of a transistor. Typically, the maximum electric field is located at the gate edge close to the drain side. By intentionally introducing some damage in the gate to drain region, a virtual gate is formed in the buffer layer, which modifies the electric field distribution and reduces the maximum electric field at the gate edge close to the drain electrode side. Since there is no implantation employed at the gate to source region in this approach, there is no intentional degradation of the source resistance.

Figure 9A:
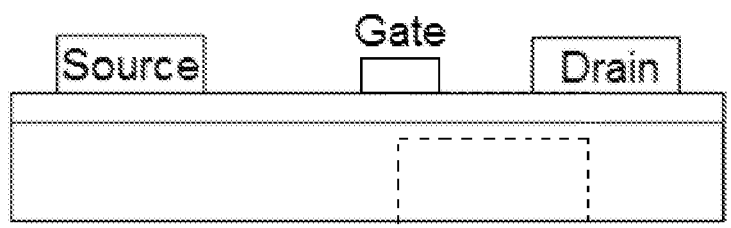
FIGS. 9A and 9B show a representation of a HEMT transistor and a selective area implantation in accordance with an embodiment of the invention.
Figure 9B:
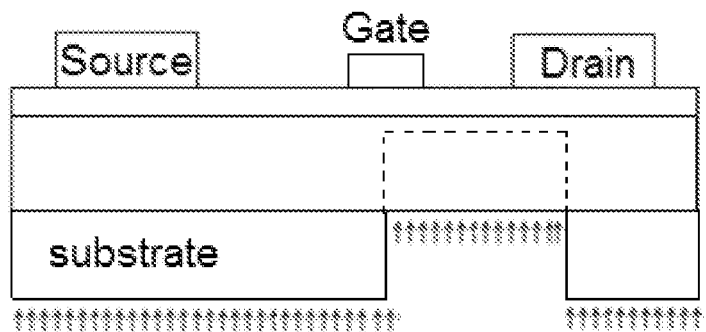

The depth of the damaged region extends below the 2DEG interface of the heterostructure of the HEMT. In certain embodiments, the protons or ions are implanted so as to extend into the underlying substrate and, in some cases, have a distribution such that the protons or ions stop below the 2DEG interface in and/or below the buffer layer (lower portion) of the HEMT heterostructure in the range of 50 nm to a few microns. In some cases, the irradiation can be performed on the front side. In other cases, after the substrate been removed, a shallow irradiation may be performed from the back side of the HEMT structures minimizing damage to the 2DEG channel layer. For embodiments using a sapphire substrate, the sapphire substrate can be completely removed using laser lift-off or dry etching. For embodiments using Si or SiC substrates, the Si and SiC substrates can be selectively removed at certain areas (see FIG. 9B) or completely removed with dry etching. After substrate removal, a wet chemical etchant may be used to etch 1-10 nm of the GaN interface layer, which often contains many defects that were created during the GaN growth on the substrate.

Although reference is made herein to a barrier layer/buffer layer heterostructure, it should be understood that interfacial and/or spacer and/or capping layers may be present.

Figure 1:
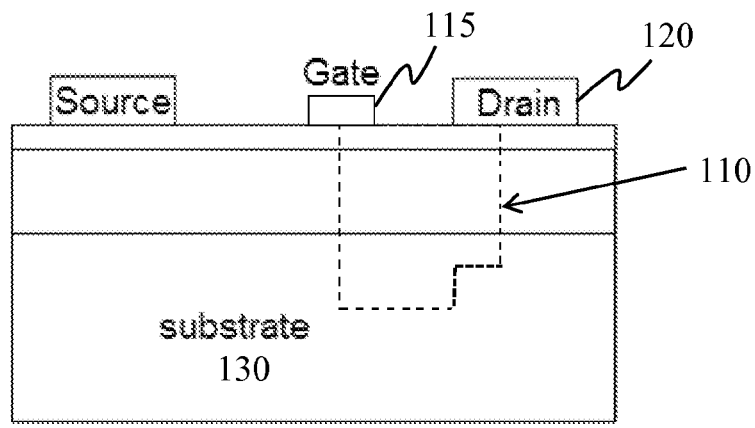
FIG. 1 shows a representation of a HEMT transistor having improved reliability in accordance with an embodiment of the invention.

FIG. 1 shows a HEMT transistor having improved reliability in accordance with an embodiment of the invention. In accordance with one embodiment, an HEMT, such as an InAlN/GaN HEMT, is provided with an intentionally "damaged" region 110 between the gate 115 and drain 120. The region 110 can extend laterally from the gate 115 to the drain 120 and may cover some or all of the gate to drain region as well as portions below the gate 115 and drain 120. The region 110 can extend vertically into the underlying substrate 130.

The selective damaging takes advantage of the reduction in electric field at the gate edge closest to the drain while enabling the source to gate region to remain with lower resistance. Although the selective irradiation/implantation is described herein as being performed for InAlN/GaN HEMTs, embodiments are not limited to the InAlN/GaN HEMT material structure and other III-IV field effect transistors may benefit from the selective irradiation/implantation described in various embodiments herein.

Figure 2A:
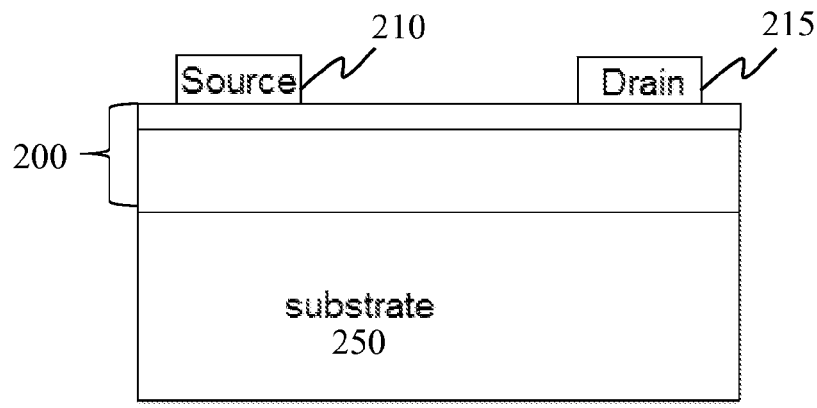
FIGS. 2A-2F illustrate a process sequence of a selective area implantation in accordance with an embodiment of the invention.

FIGS. 2A-2F illustrate a process sequence of a selective area implantation in accordance with an embodiment of the invention. Referring to FIG. 2A, an HEMT transistor can be fabricated by depositing one or more metal layers on an InAlN/GaN heterostructure 200 to form ohmic source/drain contacts 210, 215. In certain embodiments, the InAlN/GaN heterostructure 200 can be formed on a substrate 250 by metal-organic chemical vapor deposition (MOCVD) or by molecular beam epitaxy (MBE). For example, an AlN nucleation layer can be grown on a SiC or sapphire substrate, followed by about 2 μm of a GaN buffer layer and then an AlN interlayer and InAlN barrier layer. In various embodiments, the InAlN/GaN heterostructure is fabricated with an 11 nm or thinner $In_{0.17}Al_{0.83}N$ barrier layer on the GaN layer. Indeed, recently, a record current density of 2.5 A/mm at $V_G$=+2V was reported with a 6.9 nm barrier layer (InAlN layer) thickness and gate length ($L_G$) of 100 nm.

The ohmic contacts for the source 210 and drain 215 can be formed of one or more metal layers including, for example, Ti, Al, Ni, Pt, Mo, and/or Au. In one embodiment, the ohmic contacts 210, 215 can be formed of Ti/Al/Ni/Au via pattern and lift-off.

Figure 2B:
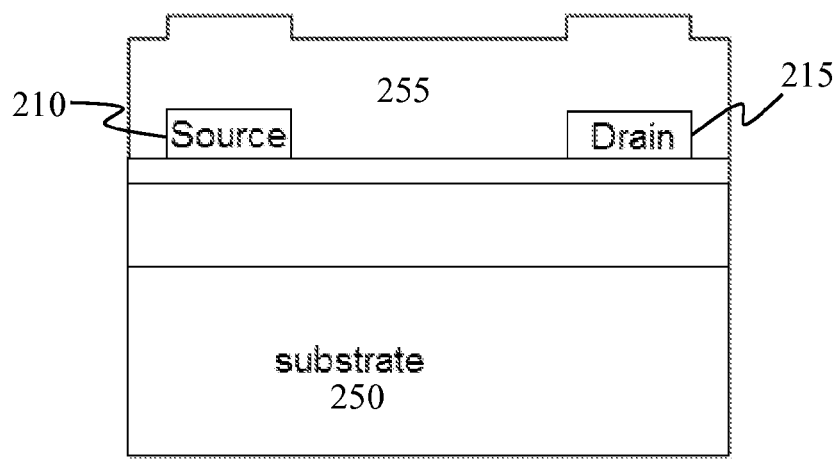
Figure 2C:
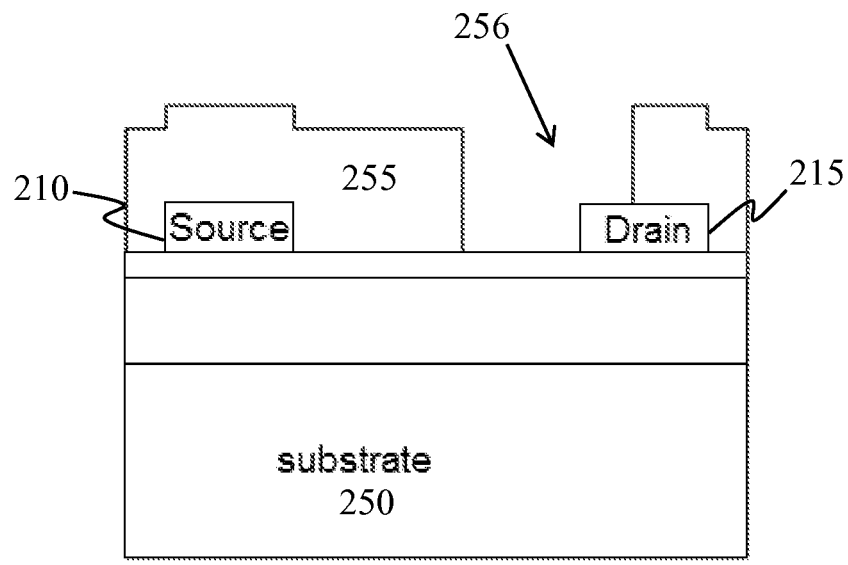

Referring to FIG. 2B, once the source and drain contacts 210, 215 are formed, a resist and/or other masking layer 255 can be formed on the substrate 250 to expose at least a portion of the gate region at the drain side as shown in FIG. 2C. For example, a photoresist 255 can be deposited on the substrate 250, and exposed and developed to provide a window (opening 256) exposing the drain region.

Figure 2D:
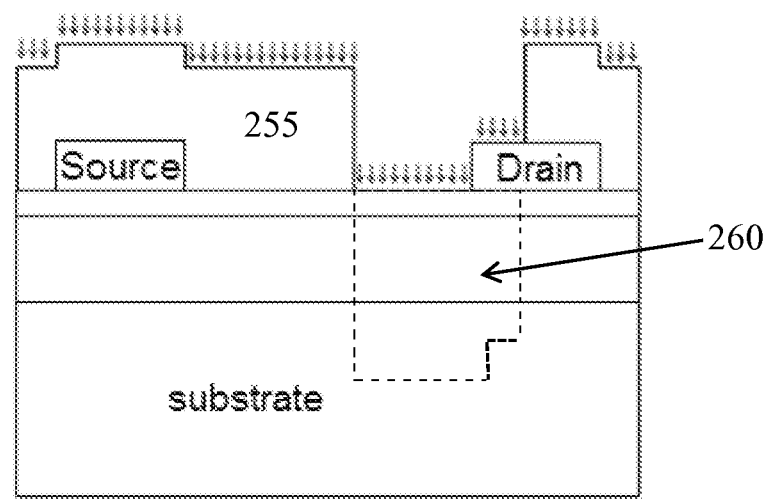

Next, referring to FIG. 2D, the substrate can undergo irradiation. In one embodiment, the irradiation is in the form of a hydrogen ion bombardment (proton irradiation). In certain embodiments, proton irradiation is performed at energies of 5 MeV-15 MeV. In other embodiments, proton irradiation is performed at energies in the hundreds of keV available by using conventional semiconductor device fabrication implantation equipment, for example at 400 keV. In one embodiment, Ge ions are used instead of hydrogen ions. In another embodiment, smaller ions (as compared to Ge ions), such as He, N, O, are used. The implant dose can depend on the selected ion—heavier ions may be implanted at smaller doses than lighter ions to achieve similar damage. In some embodiments, selective ion implantation can be performed at an energy of 300 keV-400 keV (or less) and a dose in a range of $1\times10^9$ cm$^{-2}$ to $5\times10^{15}$ cm$^{-2}$.

Figure 3:
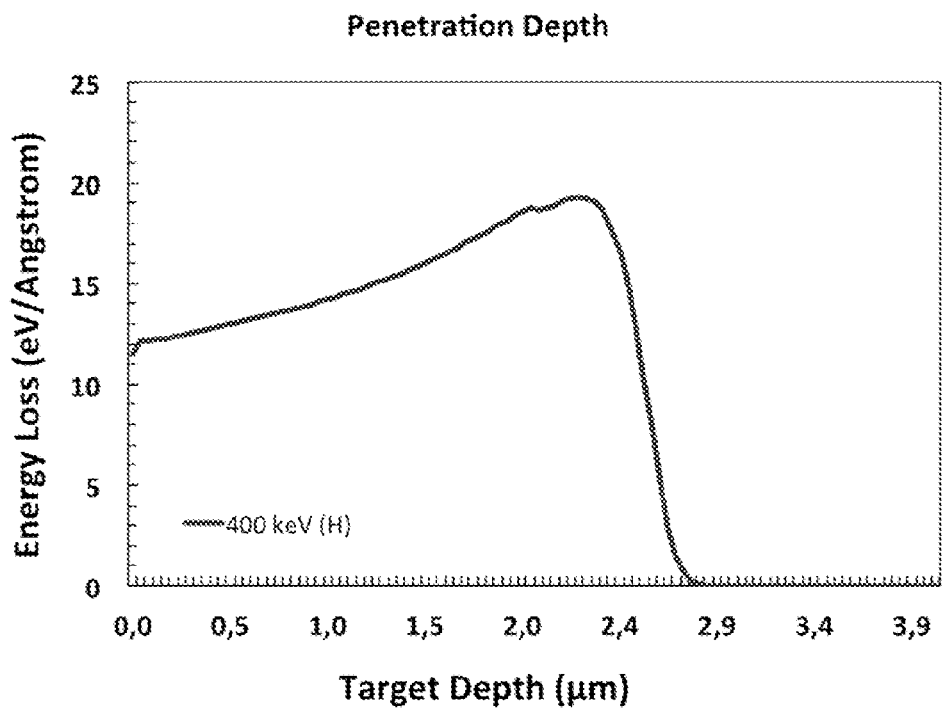
FIG. 3 shows a stopping and range of ions in matter (SRIM) simulation for a 400 keV proton implant in accordance with an embodiment of the invention, illustrating penetration depth and ion energy loss.

To illustrate the suitability of a 400 keV proton implantation, the stopping and range of ions in matter (SRIM) simulations with 400 keV of proton ions were performed and the simulation results shown in FIG. 3. Referring to FIG. 3, it can be seen that the penetration depth and energy loss of a 400 keV proton implantation is suitable for introducing damage into the drain region of the InAlN/GaN HEMT. With an 11 nm or thinner barrier layer in an InAlN/GaN heterostructure, the two dimensional electron gas (2DEG) channel is located at about 11 nm (or a thinner distance depending on the barrier layer thickness) below the surface of the HEMT heterostructure. Thus, as illustration by the simulation shown in FIG. 3, the majority of the damage induced by the proton implantation is in the substrate, not at the 2DEG channel. Since a nitride sample is transparent, the implantation can also be performed on a laser lift-off (or otherwise exposed) nitride-based HEMT structure from the back side of the HEMT structures (see FIGS. 9A and 9B). In this manner, damage to the 2DEG channel layer can be avoided or minimized.

Returning again to FIG. 2D, the ion bombardment creates a damage region 260. The photoresist/mask 255 protects the covered regions from being irradiated.

Figure 2E:
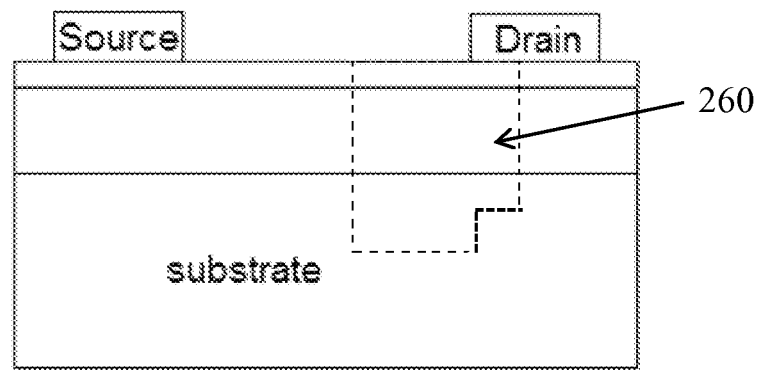
Figure 2F:
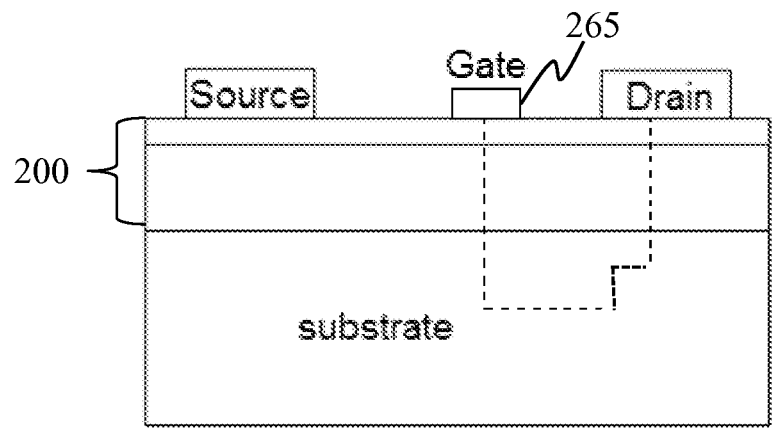

The resist/mask 255 is removed, leaving the damage region 260 at some or all of a gate-to-drain region (see FIG. 2E). A gate 265 can be formed on the InAlN/GaN heterostructure 200 as shown in FIG. 2F. The gate can be formed of one or more metal layers including, for example, Ti, Al, Ni, Pt, and/or Au.

In certain embodiments, an InAlN/GaN HEMT can be formed by forming source/drain contacts on an InAlN/GaN heterostructure; forming a damage region at all or some of a gate-to-drain region; and forming a gate electrode on the InAlN/GaN heterostructure. In one embodiment, the damage region is formed after forming the source/drain contacts and before forming the gate electrode. In another embodiment, the damage region is formed after forming the source/drain contacts and the gate electrode. In yet another embodiment, the damage region is formed before forming the source/drain contacts and the gate electrode.

In accordance with embodiments of the invention, the damage region can be formed by proton irradiation (or by Ge ion or other ion implantation). In contrast with typical implantation processes, no annealing step is performed for diffusion purposes of the protons (or Ge ions or other ions).

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

In the following examples, experiments were carried out to illustrate the effect of proton irradiation on reliability of InAlN/GaN high electron mobility transistors (HEMTs).

For the experiments, the HEMT structures were grown with a Metal Organic Chemical Vapor Deposition (MOCVD) system, starting with a thin AlGaN nucleation layer, followed with a 1.9 µm low-defect carbon-doped GaN buffer layer, 50 nm undoped GaN layer, 10.2 nm undoped InAlN layer with a 17% of In mole fraction, and capped with a 2.5 nm undoped GaN layer. The samples were all grown on three inch diameter, c-plane sapphire substrates. The 17% In mole fraction for the undoped InAlN layer was selected for its ability to grow lattice-matched to the underlying undoped GaN layer.

Hall measurements on the as-grown structures showed sheet carrier densities of $2.1 \times 10^{13}$ cm$^{-2}$ and the corresponding electron mobility of 1000 cm$^2$/V-s.

Device fabrication began with the Ohmic contact deposition by performing lift off e-beam evaporated Ti/Al/Ni/Au based metallization, and the samples were subsequently annealed at 800° C. for 30 s under a N$_2$ ambient. The contact resistance was obtained using the transmission line method (TLM) and was determined as being 0.6 Ω-mm.

Multiple energy and dose nitrogen implantation was used for the device isolation by defining the active region of the devices using a photoresist mask (photoresist AZ1045). Isolation currents were measured to be less than 10 nA at 40 V of bias voltage across two 100 µm×100 µm square Ohmic contact pads separated by a 5 µm implanted gap. 1-µm gates were defined by lift-off of e-beam deposited Pt/Ti/Au metallization. Ti/Au metallization was utilized for the interconnect metals for source, gate, and drain electrodes. The transistors were passivated using 400 nm of the plasma-enhanced chemical vapor deposited (PECVD) SiNx at 300° C., followed by opening of contact windows using fluorine-based plasma etching. The DC characteristics of the HEMTs were measured with a Tektronix curve tracer 370A and an HP 4156 parameter analyzer.

Once the device was fabricated, the samples for proton irradiation were proton irradiated in a vacuum chamber at room temperature with the MC-50 Cyclotron at the Korea Institute of Radiological and Medical Sciences. Proton beam energy was controlled from 15 to 5 MeV by inserting an aluminum degrader. The samples were mounted with carbon tape, where the front face aimed at the proton beam, which means that growth direction of the samples is parallel to the direction of the proton beam.

Certain of the devices were subjected to 5-15 MeV proton irradiations with a fixed dose of $5 \times 10^{15}$ cm$^{-2}$. Others of the devices were subjected to doses of $2 \times 10^{11}$, $5 \times 10^{13}$ or $2 \times 10^{15}$ cm$^{-2}$ of protons at a fixed energy of 5 MeV.

Figure 4:
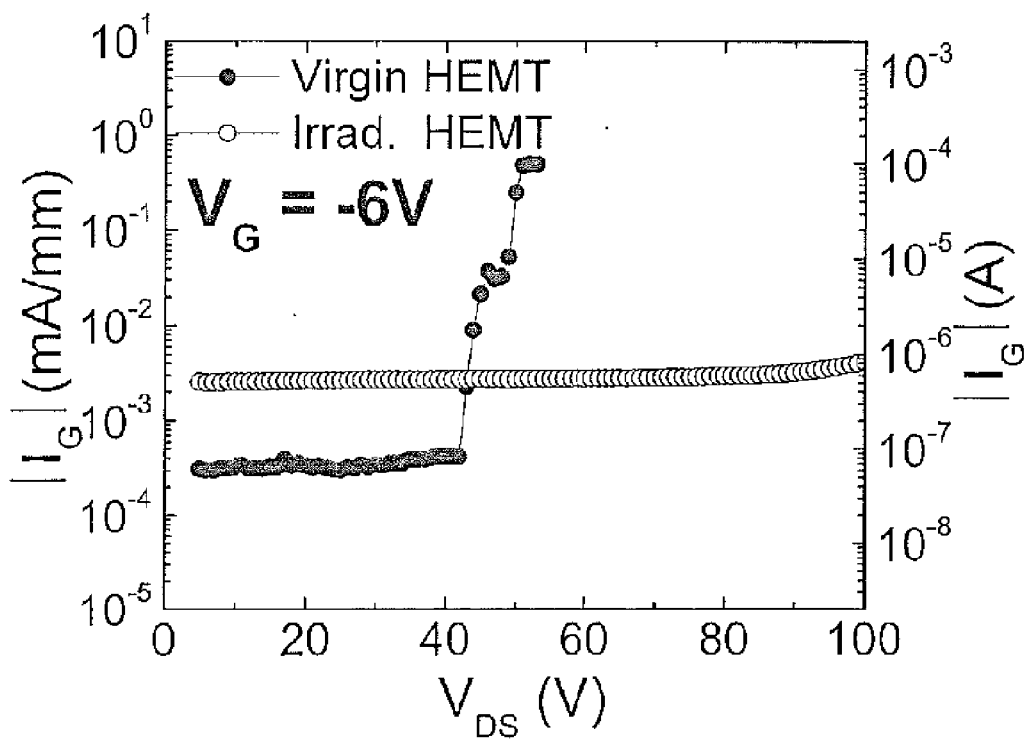
FIG. 4 shows plots of off-state gate currents as a function of drain voltage during the step-drain voltage stress for HEMTs prior to and post proton irradiation, comparing the un-irradiated and proton-irradiated HEMTs of an example embodiment of the invention.

FIG. 4 shows plots of the off-state gate current as a function of drain voltage during off-state step-stresses of InAlN/GaN HEMTs prior to and post proton irradiation at an energy of 5 MeV and dose of $5 \times 10^{15}$ cm$^{-2}$.

As shown in FIG. 4, the gate current ($I_G$) was plotted as a function of stressed drain voltage. The devices were stressed for 60 seconds at each drain voltage step, while grounding the source electrode and applying a constant voltage of –6V to the gate electrode.

After performing the proton irradiation, the off-state electrical stresses were conducted by stressing the HEMTs for 60 seconds at each drain voltage step, while grounding the source electrode and maintaining –6 V on the gate. The stress was initiated at a drain voltage of +5V, and the incremental drain voltage step was kept at 1 V. The critical voltage of the off-state stress was defined as the applied drain voltage at the onset of sudden gate current increase during the stress. There was no critical voltage observed during the drain voltage step-stress up to 100V and there were no changes for the drain and gate IV characteristics of the proton irradiated samples after the stress.

In comparison, the reference HEMTs showed a critical voltage around 40 to 50V of stepped-drain voltage, and both drain and gate IV characteristics were degraded after the stress for the un-implanted samples.

The stress started at 5 V of drain voltage and the voltage step was kept at 1 V. During the step-stress, besides monitoring $I_G$, gate-to-source leakage current ($I_{GS}$) and gate-to-drain leakage current ($I_{GD}$) were also measured. Between each step-stress, drain I-V, extrinsic transconductance, gate forward current biased from 0 to 1.5 V and gate reverse current biased from 0 to –10 V, were recorded. Self-heating effects were negligible based on the low drain-source currents under the test conditions. The critical voltage ($V_{cri}$) of the off-state step-stress was defined as the onset of a sudden Io increase during the stress.

Typical $V_{cri}$ for electrical degradation of un-irradiated HEMTs ranged from 45 to 55 V. By sharp contrast, no such critical voltage was detected for devices after proton irradiation even when the drain was biased to +100 V (limited by the available apparatus). The same results were observed for devices post 10 MeV and 15 MeV proton irradiation as well as the HEMTs exposed with different doses ranging from $2 \times 10^{11}$ to $2 \times 10^{15}$ cm$^{-2}$ of protons at fixed energy of 5 MeV.

During the off-state stress, before the gate bias voltage reached the critical voltage, there was no degradation observed for both gate and drain I-Vs of the proton irradiated devices. Once the drain bias voltage reached $V_{cri}$, not only did the gate reverse bias leakage current suddenly increase, as illustrated in FIG. 4, but also the saturation drain current decreased.

Figure 5:
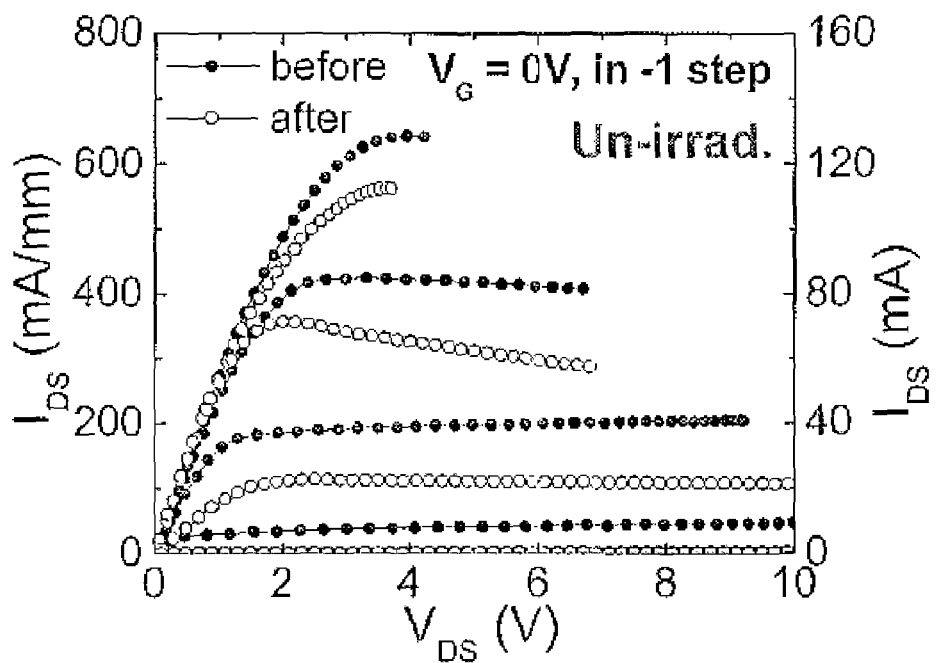
FIG. 5 shows plots of drain I-V characteristics of un-irradiated HEMTs prior to and after off-state electrical step-stress. The devices were stressed with $V_G = -6$ V for 60 s at each drain voltage step until sudden increase of $I_G$ was observed.
Figure 6:
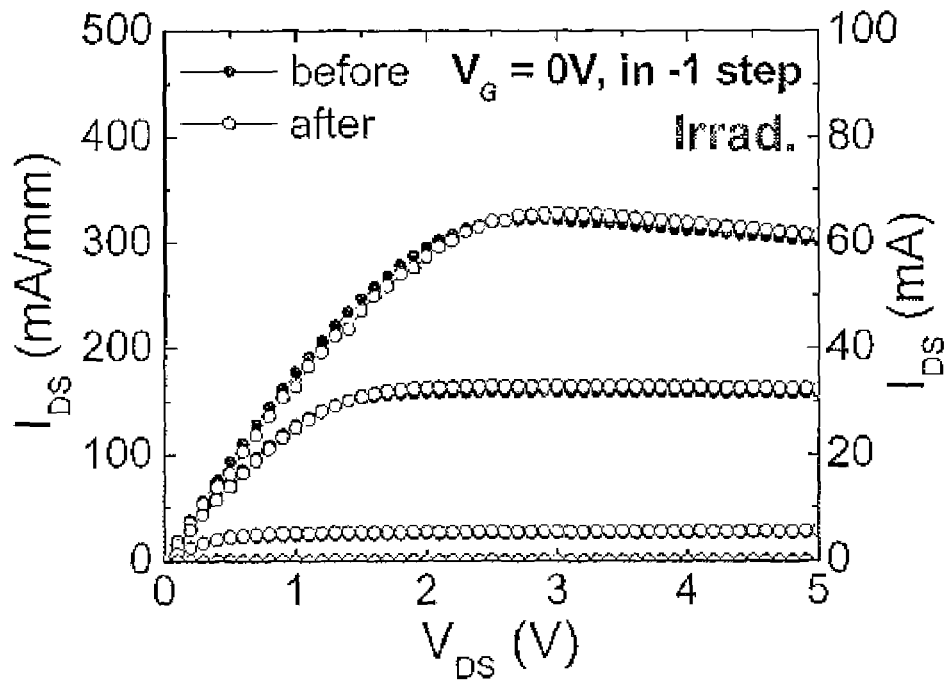
FIG. 6 shows plots of drain I-V characteristics of HEMTs irradiated with 5 MeV and $5 \times 10^{15}$ cm$^{-2}$ doses of protons prior to and after off-state electrical step-stress. The devices were stressed with $V_G = -6$ V for 60 s at each drain voltage step until drain voltage reached +100 V.

As shown in FIG. 5, the saturation drain current was reduced ~12% for the un-irradiated HEMTs after the stress. In addition, there were no obvious changes of the drain current for irradiated HEMTs, as illustrated in FIG. 6.

Figure 7:
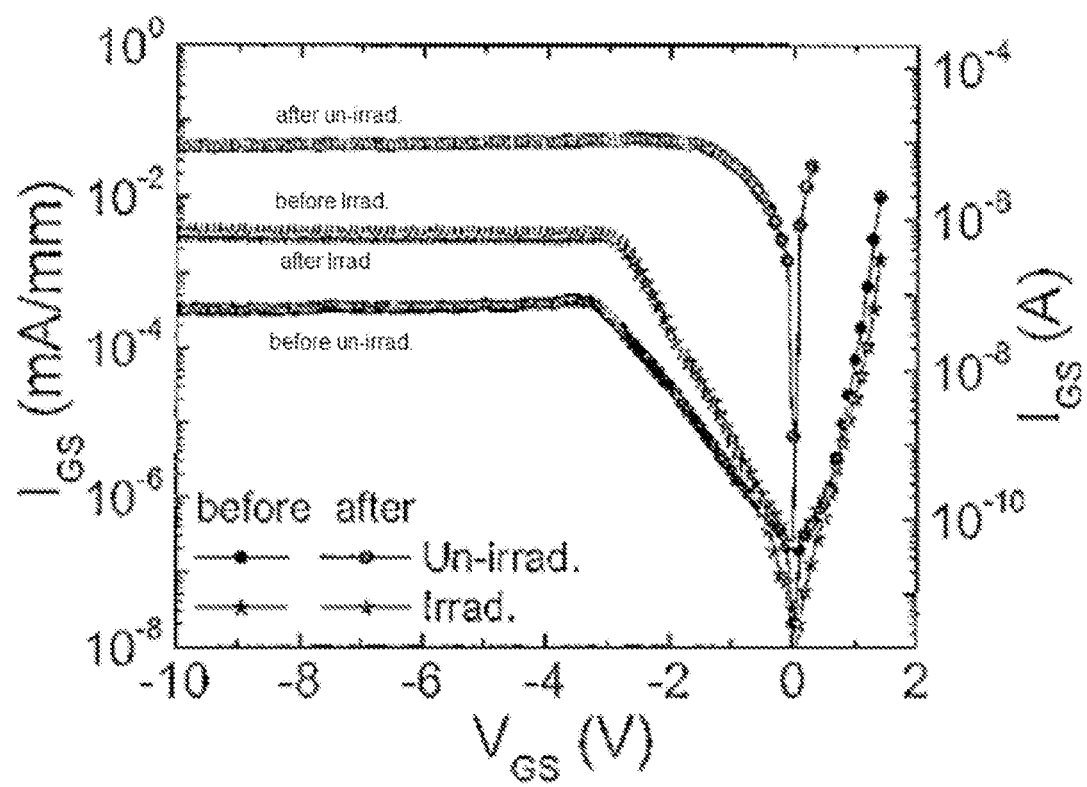
FIG. 7 shows plots of gate characteristics of un-irradiated and proton-irradiated (with 5 MeV and $5 \times 10^{15}$ cm$^{-2}$ dose) HEMTs prior to and after off-state electrical step-stress. Un-irradiated devices were stressed with $V_G = -6$ V for 60 s at each drain voltage step until sudden increase of $I_G$ was observed. The irradiated HEMT devices were stressed with $V_G = -6$ V for 60 s at each drain voltage step until drain voltage reached +100 V.

Besides drain I-V characteristics, the gate I-V characteristics exhibited a similar trend, as shown in FIG. 7. Although the gate current of the irradiated HEMT was much higher as compared to the un-irradiated HEMTs, there were no changes in gate reverse and forward characteristics after the off-state stress. The decrease of drain saturation current and increase of reverse bias gate leakage current of irradiated devices may be attributed to the reduction of sheet carrier concentration and carrier saturation velocity caused by the defects generated during the proton implantation. In contrast, the un-irradiated HEMTs exhibited permanent changes of both forward and reverse gate leakage characteristics for reference HEMTs after the stress. The reverse gate leakage increased more than two orders of magnitude for the un-irradiated HEMTs as a result of electrical stressing. Therefore, the proton irradiation provides improved I-V characteristics and may be used to minimize stress-effects found in un-irradiated HEMTs.

Figure 8:
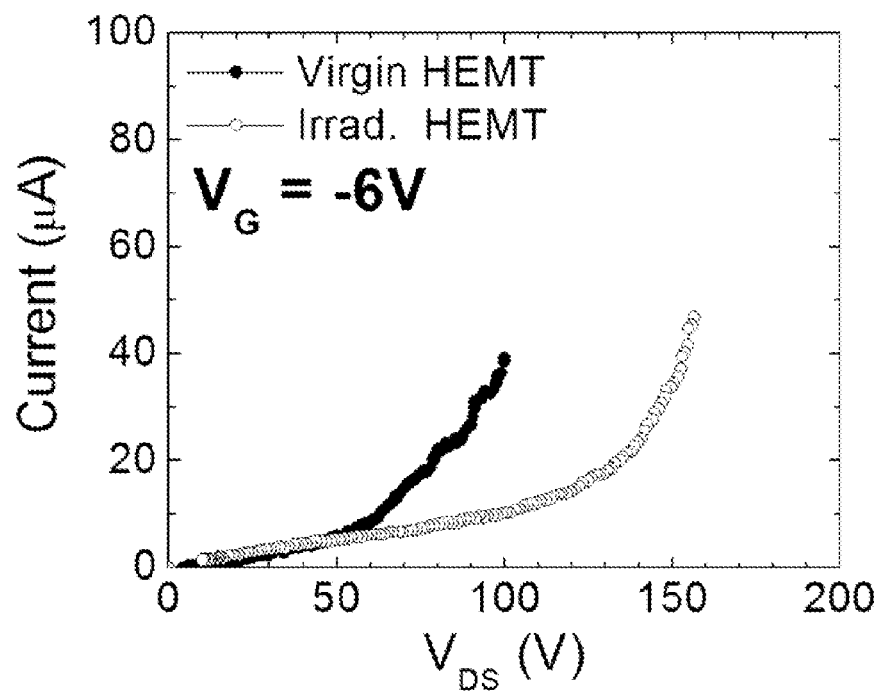
FIG. 8 shows plots of off-state breakdown measurement result of un-irradiated and proton-irradiated HEMTs.

FIG. 8 shows the measured off-state breakdown voltages of reference and proton-irradiated InAlN/GaN HEMTs. The breakdown voltage increased from 100 V in the reference device to 160 V in the proton-implantation one, which was irradiated with an energy of 5 MeV and dose of $5\times10^{15}$ cm$^{-2}$. The incident protons had energy of 5 MeV and dose of $5\times10^{15}$ cm$^{-2}$.

In the off-state stress studies, gate contact metal diffusion under the gate finger was observed along with associated threading dislocation formation, which produced extra leakage paths and was responsible for the observed gate leakage current increase (FET degradation).

In un-irradiated devices, there were many such spots, which were visible as dark features in electroluminescence (EL) spectra (not shown). It is contemplated that these spots indicate an origin of degradation and are related to metal diffusion into the semiconductor or formation of defects under the gate.

However, in the irradiated devices, there were no such preferential spots found in the EL spectra and metal appeared to diffuse uniformly after proton irradiation. This contributes to avoiding the typical critical voltage found during electrical step-stressing of un-irradiated devices. As can be illustrated by the general experiments, the reliability is effectively enhanced in devices exposed to high energy proton irradiation.

Based on SRIM simulation, the estimated vacancies around 2-DEG channel ranged from $5\times10^9$ to $2\times10^{10}$ cm$^{-2}$ when the conditions of implantation energy of 5-15 MeV and dose of $5\times10^{15}$ cm$^{-2}$ was applied, and an increase in defects that behave as trap sites are expected in the GaN buffer below the channel. These defects can perform as deep acceptor-like traps with high capture cross sections for both carrier types. The deep acceptor-like traps can capture free electrons and, in consequence, the vertical electric field beneath gate metal was increased and extended into the buffer layer. In other words, the depletion mode was modified, increasing the vertical depletion at the expense of lateral depletion. Therefore, the peak electric field in the x-direction at drain-side gate edge of the irradiated HEMT was reduced and the reliability of the irradiated HEMT at a similar drain voltage improved as compared to the reference HEMT.

Higher breakdown voltage occurs in samples with more edge-type dislocations. In addition, it has been demonstrated that there is a relationship between breakdown voltage and density of traps formed by threading dislocations, indicating that larger trap density leads to higher breakdown voltage.

Based on the experiments, it is contemplated that it is possible to rule out passivation of defects by the implanted protons, since the effects were independent of dose. One mechanism is that the leakier gate contacts of the irradiated HEMTs might also change the electrical field distributions near the gate electrode, decreasing the peak field below the threshold for degradation.

Thus, the experiments show that high energy proton irradiation over a broad range of doses can significantly reduce the degradation of InAlN/GaN HEMTs during bias stressing to establish their reliability. Similar effects are contemplated for 400 keV energies as well as for use of Ge ions.

It is further contemplated that modifying the depletion mode under the gate of HEMTs can improve critical voltage, which increases the tendency for vertical depletion instead of lateral depletion and can reduce the peak electric field in the x-direction at the drain-side gate edge, improving IV characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. A high electron mobility transistor (HEMT), comprising:
   a heterostructure for an HEMT on a substrate;
   a gate electrode on a gate region of the heterostructure;
   a source contact on a source region of the heterostructure;
   a drain contact on a drain region of the heterostructure; and
   a damage region extending laterally between a portion or all of an area from the gate region to the drain region of the heterostructure, the damage region extending vertically to the substrate,
   wherein the heterostructure for the HEMT comprises an InAlN/GaN heterostructure,
   wherein the damage region comprises protons selectively irradiated into it from the gate region to the drain region of the heterostructure to a depth below a 2DEG channel of the heterostructure,
   wherein the protons are selectively irradiated by selective proton irradiation performed either: a) at an energy in a range of 5 MeV to 15 MeV and a dose in a range of $1\times10^{11}$ cm$^{-2}$ to $5\times10^{15}$ cm$^{-2}$; or b) at an energy in a range of 300 keV to 400 keV and a dose in a range of $10^9$ cm$^{-2}$ to $5\times10^{15}$ cm$^{-2}$, and
   wherein the damage region comprises Ge ions selectively implanted into the portion or all of the area from the gate region to the drain region of the heterostructure.

2. A method of improving reliability of a high electron mobility transistor (HEMT), the method comprising:
   forming source/drain contacts respectively on a source region and a drain region of a heterostructure for an HEMT on a substrate;
   forming a gate electrode on a gate region of the barrier layer/buffer layer heterostructure; and
   forming a damage region extending laterally between a portion or all of an area from the gate region to the drain region of the heterostructure, the damage region extending vertically to the substrate,
   wherein the heterostructure for the HEMT comprises an InAlN/GaN heterostructure,
   wherein forming the damage region comprises performing a selective proton irradiation to irradiate the portion or the all of the area from the gate region to the drain region of the heterostructure to a depth below a 2DEG channel of the heterostructure, wherein the selective proton irradiation is performed either: a) at an energy in a range of 5 MeV to 15 MeV and a dose in a range of $10^{11}$ cm$^{-2}$ to $5\times10^{15}$ cm$^{-2}$; or b) at an energy in a range of 300 keV to 400 keV and a dose in a range of $1\times10^{9}$ cm$^{-2}$ to $5\times10^{15}$ cm$^{-2}$, and wherein the damage region comprises Ge ions selectively implanted into the portion or all of the area from the gate region to the drain region of the heterostructure.

3. The method of claim 2, wherein performing the selective proton irradiation comprises:

forming a masking layer on the substrate, exposing the portion or the all of the area from the gate region to the drain region of the heterostructure; and irradiating the substrate having the masking layer with protons.

4. The method of claim 2, wherein forming the damage region extending laterally between the portion or the all of the area from the gate region to the drain region of the heterostructure, the damage region extending vertically to the substrate, comprises:

performing a selective ion implantation to damage the portion or the all of the area from the gate region to the drain region of the heterostructure.

5. The method of claim 4, wherein performing the selective ion implantation to damage the portion or the all of the area from the gate region to the drain region of the heterostructure comprises:

forming a masking layer on the substrate, exposing the portion or the all of the area from the gate region to the drain region of the heterostructure; and implanting the Ge ions into the substrate having the masking layer.

6. The method of claim 4, wherein the selective ion implantation is performed using Ge, He, N, or O ions.

7. The method of claim 2, wherein the damage region is formed before forming the gate electrode.

8. The method of claim 2, wherein the damage region is formed after forming the source/drain contacts.

* * * * *

UNITED STATES PATENT AND TRADEMARK OFFICE
CERTIFICATE OF CORRECTION

PATENT NO. : 9,236,443 B2
APPLICATION NO. : 14/420496
DATED : January 12, 2016
INVENTOR(S) : Fan Ren et al.

It is certified that error appears in the above-identified patent and that said Letters Patent is hereby corrected as shown below:

On The Title Page

Abstract,
line 5, "InηAΓN/GaN HEMT" should read --InAlN/GaN HEMT--.

In The Specification

Column 1,
line 14, "Grant No. 1-11-1-0020" should read --Grant No. HDTRA 1-11-1-0020--.

Column 2,
line 52, "filed" should read --field--.

Column 3,
line 23, "substrate been" should read --substrate has been--.

Column 9,
line 1, "the all of the" should read --all of the--.

Column 9,
line 16, "the all of the" should read --all of the--.

Column 9,
line 21, "the all of the" should read --all of the--.

Column 10,
line 5, "the all of the" should read --all of the--.

Signed and Sealed this
Nineteenth Day of July, 2016

Michelle K. Lee
*Director of the United States Patent and Trademark Office*

CERTIFICATE OF CORRECTION (continued)
U.S. Pat. No. 9,236,443 B2

In The Specification

<u>Column 10,</u>
line 8, "the all of the" should read --all of the--.

<u>Column 10,</u>
line 11, "the all of the" should read --all of the--.